United States Patent
Huang et al.

(10) Patent No.: US 6,457,354 B1
(45) Date of Patent: Oct. 1, 2002

(54) GAS FLOW SENSOR

(76) Inventors: Tai-Tung Huang, 10430 Westchester Ave., San Diego, CA (US) 92126; Po-Hao Huang, 10430 Westchester Ave., San Diego, CA (US) 92126

(*) Notice: Subject to any disclaimer, the term of this patent is extended or adjusted under 35 U.S.C. 154(b) by 0 days.

(21) Appl. No.: 09/870,912

(22) Filed: Jun. 1, 2001

(51) Int. Cl.⁷ .................................................. G01F 3/14
(52) U.S. Cl. ............................................ 73/248; 137/554
(58) Field of Search ............................ 73/31.05, 31.04, 73/248, 254, 262, 269, 270, 232, 239, 800, 723, 705; 116/266; 200/83 J; 340/626; 137/554, 556

(56) References Cited

U.S. PATENT DOCUMENTS

| | | | | |
|---|---|---|---|---|
| 3,556,122 A | * | 1/1971 | Laerdal | 137/102 |
| 4,098,284 A | * | 7/1978 | Yamada | 137/39 |
| 5,452,613 A | * | 9/1995 | Bills et al. | 73/745 |
| 5,584,319 A | * | 12/1996 | Cholin | 137/554 |
| 5,727,594 A | * | 3/1998 | Choksi | 137/859 |
| 6,164,958 A | * | 12/2000 | Huang et al. | 431/16 |
| 6,189,565 B1 | * | 2/2001 | Skog | 137/554 |

* cited by examiner

Primary Examiner—Benjamin R. Fuller
Assistant Examiner—Charlene Dickens
(74) Attorney, Agent, or Firm—Calif Tervo

(57) ABSTRACT

Gas flow sensor 10 generally comprises housing 20 defining internal cavity 40, diaphragm assembly 50 separating internal cavity 40 into first chamber 42 in communication with gas inlet 44 and second chamber 46 in communication with gas outlet 49 and having orifices 66 therethrough for passage of gas, valve 70 mounted on diaphragm assembly 50 for closing and opening orifices 66; and a sensing unit 80 sensing when diaphragm assembly 50 has moved at least to a predetermined location. Incoming gas moves diaphragm assembly such that valve 70 is pressed against wall 47 of second chamber 46 whereby valve 70 is opened and gas passes through orifices 66 and out gas outlet 49.

17 Claims, 1 Drawing Sheet

GAS FLOW SENSOR

FIELD OF THE INVENTION

This invention relates in general to gas flow sensors for detecting the flow of gas in a gas conduit, and more specifically involves a very simple, fail-safe, gas flow sensor.

BACKGROUND OF THE INVENTION

Gas burners, such as gas ranges, are subject to failures and other conditions that render them dangerous. For example, if a burner fails to light or is extinguished by an overflowing pot, continued gas flow may result in an explosion or fire or may suffocate people. Many fires, explosions, and suffocations are attributable each year to gas burners. Therefore, there has been a need for a safety system for a gas range that turns off the gas supply to the range upon detection of a gas leak, absence of a flame, or smoke. Such a safety system requires a fail-safe gas flow sensor.

SUMMARY OF THE INVENTION

This invention is a gas flow sensor, generally comprising a housing defining an internal cavity, a diaphragm assembly separating the internal cavity into a first chamber in communication with a gas inlet and a second chamber in communication with a gas outlet and having orifices therethrough for passage of gas, a valve mounted on the diaphragm assembly for closing and opening the orifices; and a sensing unit sensing when the diaphragm assembly has moved at least to a predetermined location.

In an exemplary embodiment, the diaphragm assembly includes a diaphragm having a flexible outer portion and a central piston including a bore therethrough through which a valve stem is mounted. A valve face, connected to the stem within the first chamber, moves between a closed position closing the orifice and piston bore and an open position wherein gas can pass through the orifice, resulting from the stem being pushed against a wall of the second chamber.

The features and advantages of the invention will be readily understood when the detailed description thereof is read in conjunction with the accompanying drawings wherein like reference numerals refer to like parts throughout.

DETAILED DESCRIPTION OF THE INVENTION

Figure 1:
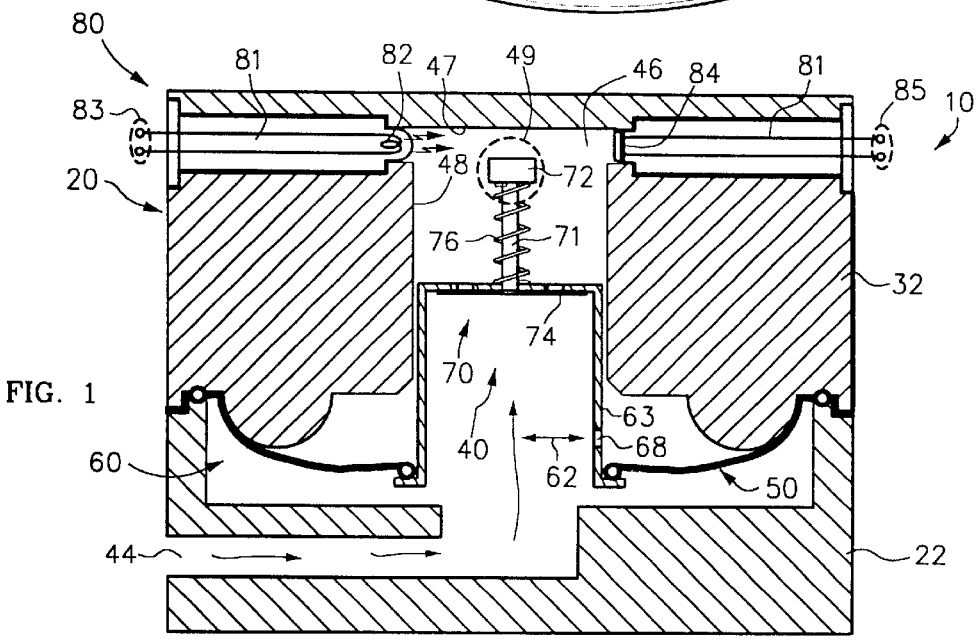
FIG. 1 is a cross-sectional view of a preferred embodiment of the gas flow sensor of the invention showing the valve in the closed position.

FIG. 1 is a cross-sectional view of a preferred embodiment of the gas flow sensor 10 of the invention. Sensor 10 would commonly be used to detect the presence of a gas flow, such as to a gas cooking range, so it will be described in terms of that environment. Sensor 10 could be used in a gas range safety system such as shown and described in our previous patent titled SAFETY SYSTEM FOR GAS RANGE, U.S. Pat. No. 6,164,958 which is fully incorporated herein. Sensor 10 could be used as "gas flow sensor 81" of that disclosure and could be connected to detection circuitry as shown therein or as is otherwise well-known in the art.

Sensor 10 generally includes a housing 20; a diaphragm assembly 50 including a diaphragm 60 and valve means, such as valve 70, and sensor means 80, such as photocell sensor 81.

Figure 2:
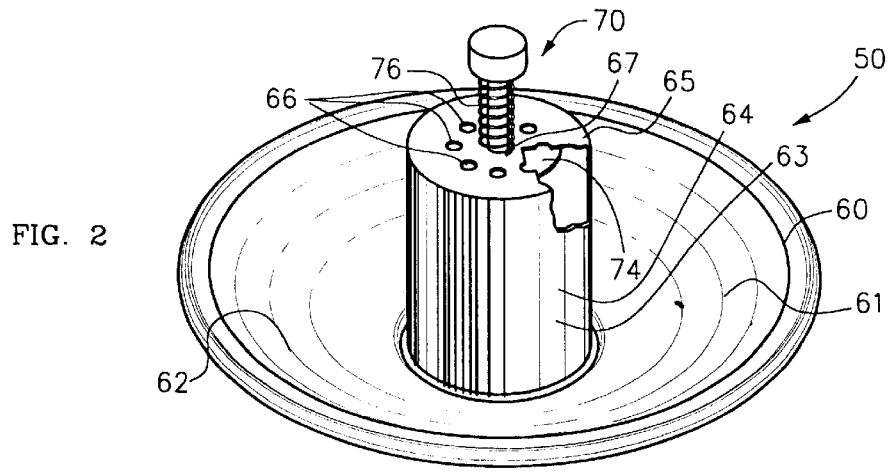
FIG. 2 is a perspective view, partially cut away, of the diaphragm assembly of the sensor of FIG. 1.
Figure 3:
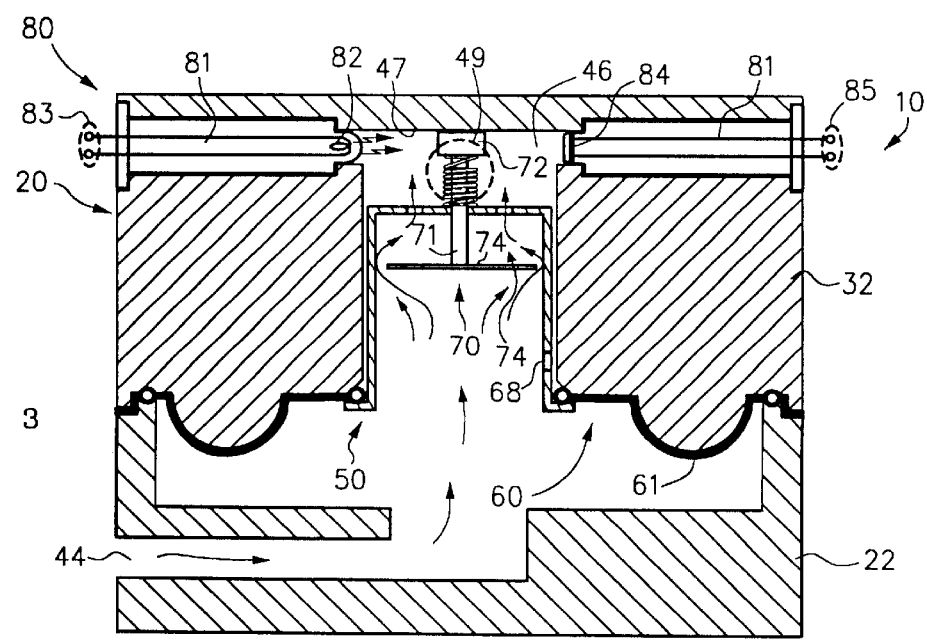
FIG. 3 is a cross-sectional view of the gas flow sensor of FIG. 1 showing the valve in the open position.

FIG. 1 shows valve 70 in the closed position. FIG. 2 is a perspective view, partially cut away, of diaphragm assembly 50 of the sensor of FIG. 1. FIG. 3 is a cross-sectional view of the gas flow sensor 10 of FIG. 1 showing valve 70 in the open position.

Housing 20 may be made of any suitable material, such as of metal such as of aluminum, or of plastic, for transporting gas, such as natural gas or propane. Housing 20, shown, is made of two sections, lower section 22 and upper section 32, joined together. Housing 20 defines an internal cavity 40. Housing 20 includes a gas inlet 44 to cavity 40 for receiving gas from a source and a gas outlet 49 from cavity 40 for dispensing gas.

Diaphragm assembly 50 is mounted in housing 20 between lower section 22 and upper section 32 and separates internal cavity 40 into a first chamber 42 in fluid communication with gas inlet 44 and a second chamber 46 in fluid communication with gas outlet 49. Second chamber 46 has a wall 47 opposite diaphragm assembly 50.

Referring to FIG. 3, diaphragm assembly 50 comprises a diaphragm 60 having a plurality of orifices 66 therethrough for passage of gas therethrough and a bore 67 therethrough and a valve 70 mounted in bore 67. Diaphragm assembly 50 serves as a flexible, gas-impervious partition.

As shown, outer portion of diaphragm 60 is a flexible membrane 61 having an inner bore 62. The inner portion of diaphragm 60 is a rigid piston 63 mounted in bore 62. Piston 63 is a hollow cylindrical member having an outer side wall 64 and an end wall 65. Piston 63 may be made of any suitable material, such as metal or plastic. Second chamber 46 includes guide means, such as side wall 48, for guiding movement of piston 63. End wall 65 of piston 63 includes diaphragm orifices 66 for passage of gas therethrough and includes bore 67 therethrough.

Valve 70 is mounted in bore 67 in end wall 65 of piston 63. Valve 70 includes a stem 71 disposed through bore 67, a face 74 connected to stem 71 within first chamber 42, and biasing means, such as compression spring 76. Valve stem 71 terminates in an end cap 72 of larger diameter than stem 71 for retaining spring 76. Spring 76 operates between end wall 65 and stem cap 72. Valve 70 is movable between a closed position wherein spring 76 biases stem 71 such that face 74 covers and seals orifices 66 and piston bore 67, and an open position wherein face 74 is moved away from end wall 65 such that gas can pass through orifices 66.

Sensor means 80 is disposed in second chamber 46 for sensing when diaphragm assembly 50 has moved at least to a predetermined location toward wall 47. Photocell sensor 81 comprises a light source, such as an infrared light 82, and photoelectric cell 84 mounted in housing 20 near opposite wall 47 of second chamber 46, and associated circuitry as is well-known in the art. Light 82 emits a light receivable and detectable by photoelectric cell 84 across second chamber 46. Wires 83 are connected to an electrical source for supplying light 82 with current. Wires 85 connect photoelectric cell 84 with circuitry well-known in the art to indicate whether photocell 84 is receiving light from light 82. The no-gas-flow signal is a "high" output signal from photoelectric cell 84. Thus should light 82 or photoelectric cell 84 fail, a false gas-flow indication will be sensed. This condition can be checked and repaired. However, failure of these components cannot produce an false no-flow signal, which is the dangerous condition. Thus, sensor 10 is very safe.

Gas flow sensor 10 functions as follows. Incoming gas in gas inlet 44 enters first chamber 42. The resultant gas pressure increase in first chamber 42 flexes diaphragm assembly 50 upward toward opposite wall 47. Piston 63 is guided upward by side wall 48. End cap 72 of valve stem 71 blocks light from light 82 from reaching photoelectric cell 84, indicating that gas is flowing. Then, end cap 72 is pressed against wall 47 sufficiently to overcome bias of spring 76 such that valve 70 is moved to the open position with face 74 away from end wall 65 such that gas can flow through orifices 66 into second chamber 46 and out gas outlet 49. Thus, a gas-flow indication is produced by photoelectric cell 84 before valve 70 opens and gas begins to flow. A gas bypass 68 is provided between first chamber 42 and second chamber 46 to balance pressure between them. As shown, bypass 68 is in side wall 64 of piston 63 but could be through another location, such as through housing 20 or through another location on diaphragm assembly 50. A bypass 68 having a diameter in the range of 0.003"–0.004" provides sufficient gas flow to keep the pressure balanced between chambers 42, 47 when gas is not flowing but not sufficient gas flow to pose any danger. Bypass 68 prevents small changes in upstream or downstream pressure from moving diaphragm 60 so as to give a false flow reading.

From the foregoing description, it is seen that sensor 10 of the present invention provides an extremely simple, efficient, and re liable device for indicating whether gas is flowing in a conduit and with which gas cannot flow without being sensed.

Although a particular embodiment of the invention has been illustrated and described, various changes may be made in the form, composition, construction, and arrangement of the parts herein without sacrificing any of its advantages. Therefore, it is to be understood that all matter herein is to be interpreted as illustrative and not in any limiting sense, and it is intended to cover in the appended claims such modifications as come within the true spirit and scope of the invention.

We claim:

1. A gas flow sensor comprising:
 a housing defining an internal cavity; said housing including:
  a gas inlet to said cavity for receiving gas from a source; and
  a gas outlet from said cavity for dispensing gas;
 a diaphragm assembly separating said internal cavity into a first chamber in communication with said gas inlet and a second chamber in communication with said gas outlet; said second chamber having a wall opposite said diaphragm assembly; said diaphragm assembly comprising:
  a diaphragm having an orifice therethrough for passage of gas therethrough and a bore therethrough; and
  valve means mounted on said diaphragm for moving between a closed position sealing said orifice and an open position wherein gas can pass through said orifice; and
 sensor means disposed in said second chamber for sensing when said diaphragm assembly has moved at least to a predetermined location toward said wall;
 wherein gas entering said first chamber flexes said diaphragm toward said wall such that said valve means is pressed against said wall and is moved to the open position.

2. A gas flow sensor comprising:
 a housing defining an internal cavity; said housing including:
  a gas inlet to said cavity for receiving gas from a source; and
  a gas outlet from said cavity for dispensing gas;
 a diaphragm assembly separating said internal cavity into a first chamber in communication with said gas inlet and a second chamber in communication with said gas outlet; said second chamber having a wall opposite said diaphragm assembly; said diaphragm assembly comprising:
  a diaphragm having an orifice therethrough for passage of gas therethrough and a bore therethrough; and
  a valve mounted on said diaphragm comprising:
   a stem disposed through said bore; and
   a face connected to said stem; and
  biasing means; said valve movable between a closed position wherein said biasing means biases said valve such that said face seals said orifice and said bore, and an open position wherein said face is moved away from said orifice such that gas can pass through said orifice; and
 sensor means disposed in said second chamber for sensing when said diaphragm assembly has moved at least to a predetermined location toward said wall;
 wherein gas entering said first chamber flexes said diaphragm toward said wall such that said stem is pressed against said wall and said valve is moved to the open position.

3. The sensor of claim 2 wherein:
 said biasing means includes a spring disposed in said second chamber.

4. The sensor of claim 2 wherein:
 said sensor means senses said diaphragm movement before said valve opens.

5. The sensor of claim 2 wherein:
 said sensor means comprises:
  a light source; and
  a photoelectric cell.

6. The sensor of claim 2 wherein:
 said sensor means comprises:
  a light source; and
  a photoelectric cell; and said sensor means senses said diaphragm movement before said valve opens.

7. A gas flow sensor comprising:
 a housing defining an internal cavity; said housing including:
  a gas inlet to said cavity for receiving gas from a source; and
  a gas outlet from said cavity for dispensing gas;
 a diaphragm assembly separating said internal cavity into a first chamber in communication with said gas inlet and a second chamber in communication with said gas outlet; said second chamber having a wall opposite said diaphragm; said diaphragm assembly comprising:
  a diaphragm including:
   a flexible outer portion; and
   a rigid inner portion having an orifice therethrough for passage of gas therethrough and a bore therethrough; and a valve mounted on said diaphragm inner portion comprising:
   a stem disposed through said bore; and
   a face connected to said stem; and
biasing means; said valve movable between a closed position wherein said biasing means biases said valve such that said face covers and seals said orifice and said bore, and an open position wherein said face is moved away from said orifice such that gas can pass through said orifice; and
sensor means disposed in said second chamber for sensing when said diaphragm assembly has moved at least to a predetermined location toward said wall;
wherein gas entering said first chamber flexes said diaphragm toward said wall such that said stem is pressed against said wall and said valve is moved to the open position.

8. The sensor of claim 7 wherein:
said biasing means includes a spring disposed in said second chamber.

9. The sensor of claim 7 wherein:
said sensor means senses said diaphragm movement before said valve opens.

10. The sensor of claim 7 wherein:
said sensor means comprises:
   a light source; and
   a photoelectric cell.

11. The sensor of claim 10 wherein:
said sensor means comprises:
   a light source; and
   a photoelectric cell; and said sensor means senses said diaphragm movement before said valve opens.

12. A gas flow sensor comprising:
a housing defining an internal cavity; said housing including:
   a gas inlet to said cavity for receiving gas from a source; and
   a gas outlet from said cavity for dispensing gas;
a diaphragm assembly comprising:
   a diaphragm separating said internal cavity into a first chamber in communication with said gas inlet and a second chamber in communication with said gas outlet; said second chamber having a wall opposite said diaphragm; said diaphragm having a bore therethrough and including:
      a piston mounted in said diaphragm bore; said piston having an orifice therethrough for passage of gas therethrough and a bore therethrough; said piston including:
         a valve mounted in said piston bore comprising:
            a stem disposed through said piston bore; and
            a face connected to said stem within said first chamber; and
         biasing means; said valve movable between a closed position wherein said biasing means biases said valve such that said face covers and seals said orifice and said piston bore, and an open position wherein said face is moved away from said orifice such that gas can pass through said orifice; and
sensor means disposed in said second chamber for sensing when said diaphragm assembly has moved at least to a predetermined location toward said wall;
wherein gas entering said first chamber flexes said diaphragm toward said wall such that said stem is pressed against said wall and said valve is moved to the open position.

13. The sensor of claim 12 wherein:
said biasing means includes a spring disposed in said second chamber.

14. The sensor of claim 12 wherein:
said sensor means senses said diaphragm movement before said valve opens.

15. The sensor of claim 12 wherein:
said sensor means comprises:
   a light source; and
   a photoelectric cell.

16. The sensor of claim 12 wherein:
said sensor means comprises:
   a light source; and
   a photoelectric cell; and said sensor means senses said diaphragm movement before said valve opens.

17. The sensor of claim 12 wherein:
said second chamber includes guide means for guiding movement of said piston.

* * * * *